(12) United States Patent
Wu et al.

(10) Patent No.: US 7,638,442 B2
(45) Date of Patent: Dec. 29, 2009

(54) METHOD OF FORMING A SILICON NITRIDE LAYER ON A GATE OXIDE FILM OF A SEMICONDUCTOR DEVICE AND ANNEALING THE NITRIDE LAYER

(75) Inventors: Cheng-Ta Wu, Keelung (TW); Da-Yu Chuang, Changhua County (TW); Yen-Da Chen, Changua County (TW); Lihan Lin, Taoyuan County (TW)

(73) Assignee: ProMOS Technologies, Inc., Hsinchu (TW)

( * ) Notice: Subject to any disclaimer, the term of this patent is extended or adjusted under 35 U.S.C. 154(b) by 35 days.

(21) Appl. No.: 12/149,906

(22) Filed: May 9, 2008

(65) Prior Publication Data

US 2009/0280654 A1 Nov. 12, 2009

(51) Int. Cl.
*H01L 21/00* (2006.01)
(52) U.S. Cl. .................. 438/786; 438/769; 438/770; 438/778
(58) Field of Classification Search ......... 438/761–786; 257/E21.268, 279, 293, 625, E29.152
See application file for complete search history.

(56) References Cited

U.S. PATENT DOCUMENTS

| 6,245,689 | B1 * | 6/2001 | Hao et al. ................. 438/769 |
| 6,455,389 | B1 * | 9/2002 | Huang et al. ............... 438/305 |
| 6,706,644 | B2 * | 3/2004 | Burnham et al. ............ 438/775 |
| 6,737,362 | B1 * | 5/2004 | Chen et al. ................. 438/776 |
| 7,053,006 | B2 * | 5/2006 | Hyun et al. ................. 438/761 |
| 7,078,302 | B2 * | 7/2006 | Ma et al. .................... 438/299 |
| 7,176,094 | B2 * | 2/2007 | Zhong et al. ................ 438/287 |
| 7,265,065 | B2 * | 9/2007 | Wang et al. ................. 438/792 |
| 2003/0170956 | A1 | 9/2003 | Zhong et al. |
| 2004/0005748 | A1 * | 1/2004 | Hyun et al. ................. 438/197 |
| 2006/0178018 | A1 * | 8/2006 | Olsen ......................... 438/786 |
| 2006/0246739 | A1 * | 11/2006 | Wang et al. ................. 438/775 |
| 2007/0093013 | A1 * | 4/2007 | Chua et al. ................. 438/197 |

* cited by examiner

*Primary Examiner*—Michael S Lebentritt
(74) *Attorney, Agent, or Firm*—Finnegan, Henderson, Farabow, Garrett & Dunner

(57) ABSTRACT

A process for forming a silicon nitride layer on a gate oxide film as part of formation of a gate structure in a semiconductor device includes: forming a layer of silicon nitride on top of a gate oxide film on a semiconductor substrate by a nitridation process, heating the semiconductor substrate in an annealing chamber, exposing the semiconductor substrate to $N_2$ in the annealing chamber, and exposing the semiconductor substrate to a mixture of $N_2$ and $N_2O$ in the annealing chamber.

14 Claims, 7 Drawing Sheets

Figure 4

| DPN | PNA | spacer | | CA_OL_PD fF/um | CA_OL_PDK fF/um | CA_OL_ND fF/um | CA_OL_NDK fF/um |
|---|---|---|---|---|---|---|---|
| 14% | N2 | 450A | #1 | | 0.7554 | | 0.271 |
| 16% | N2 | 450A | #4 | | 0.4775 | | 0.274 |
| 16% | N2O | 450A | #9 | | 0.1968 | | 0.284 |
| 18% | N2 | 450A | #5 | | 0.2505 | | 0.284 |
| 20% | N2 | 450A | #12 | | 0.2170 | | 0.289 |
| 22% | N2 | 450A | #13 | | 0.2080 | | 0.295 |
| POR (skip) | N2 | 450A | #14 | 0.218 | 0.1809 | 0.314 | 0.226 |
| POR (skip) | N2 | 450A | #15 | 0.220 | 0.1822 | 0.310 | 0.225 |

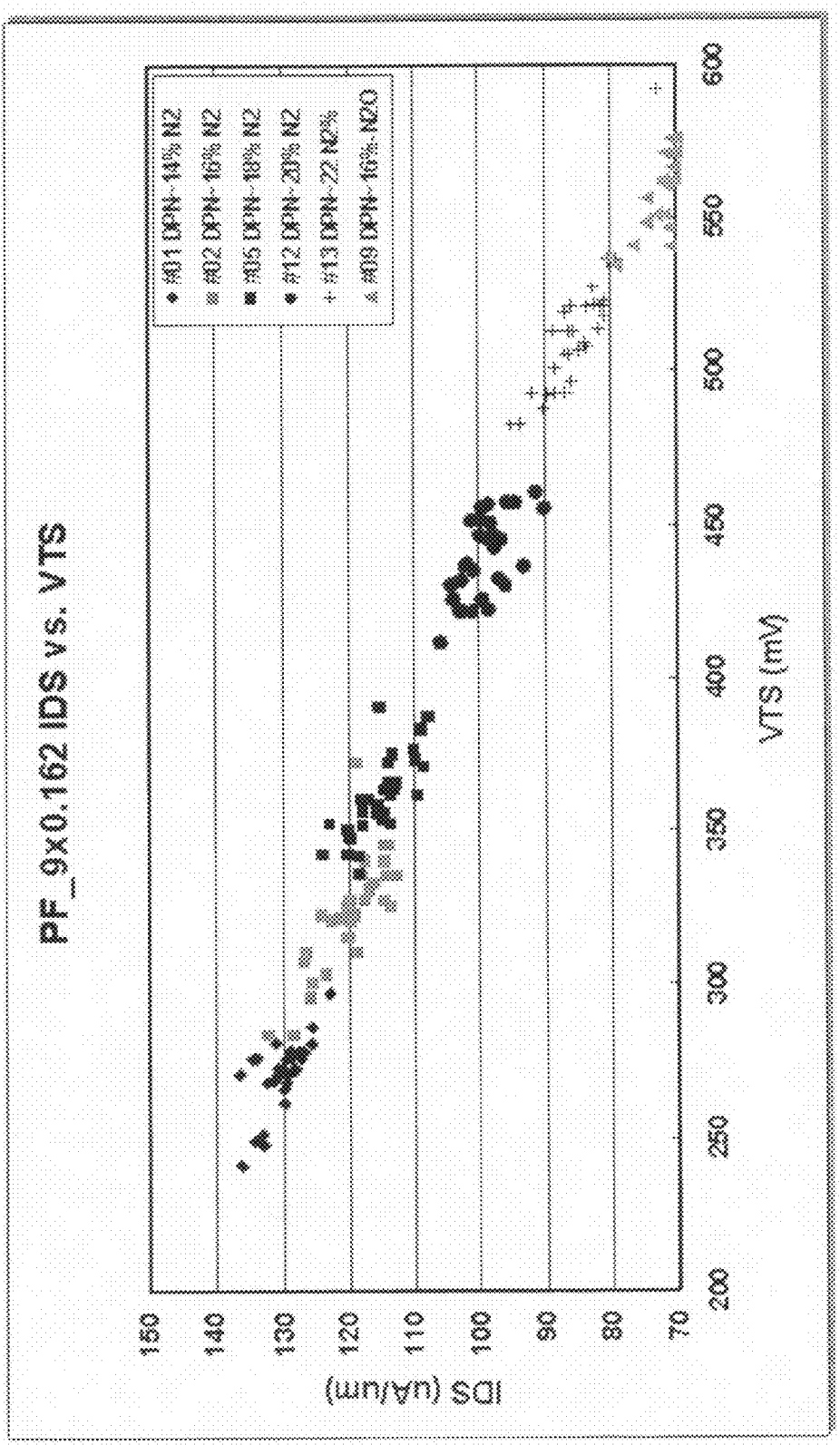

METHOD OF FORMING A SILICON NITRIDE LAYER ON A GATE OXIDE FILM OF A SEMICONDUCTOR DEVICE AND ANNEALING THE NITRIDE LAYER

BACKGROUND

This invention relates to a manufacturing process for a semiconductor device. Further, the invention relates to the formation of a semiconductor device that contains gate structures. In particular, the invention relates to the formation of a silicon nitride layer on top of a gate oxide film, as part of a gate structure in a semiconductor device.

In the semiconductor industry, the continual shrinking of device size from product generation to product generation brings about many technical challenges in manufacturing semiconductor devices. One such challenge pertains to the gate oxide film of MOSFET (Metal-Oxide-Semiconductor Field Effect Transistor) devices. The gate oxide film is a layer of oxide sandwiched between the semiconductor substrate and the gate (transistor) structure. As device size shrinks, the thickness of the gate oxide also shrinks. However, at some point, the oxide becomes too thin to provide sufficient electrical insulation between the conductive materials in the gate and the underlying semiconductor substrate. Also, a thinner gate oxide film is more susceptible to having implanted dopant ions diffuse into the gate oxide. These results can lead to performance issues with the transistor, as well as with the overall device.

Nitridation, the process of forming a gate insulating layer having a silicon nitride layer on top of the gate oxide, is one technology that has been developed to address such performance issues. A gate oxide film with a thin silicon nitride top layer can possess greater electrical insulative ability than a gate oxide film of the same thickness that has no silicon nitride top layer. In addition, a silicon nitride top layer provides resistance to the diffusion of dopants into the gate oxide.

One method of nitridation is decoupled plasma nitridation (DPN). The nitride film grown by DPN serves as an implant barrier so that, in subsequent ion implantation steps, dopants are prevented from migrating into the bulk of the gate oxide in the gate insulating layer during subsequent thermal processing steps. This also serves to preserve the insulating properties of the gate insulating layer and prevent electrical performance issues. As a result, DPN has become a useful process step in manufacturing semiconductor devices at and below the 60 nm technology threshold.

Nitridation processes, such as DPN, can be employed in the formation of surface p-channel MOSFET devices. Boron is a common dopant used to form p+ polysilicon gate structures in surface p-channel MOSFET devices. Performing DPN on the gate oxide film of a p+ polysilicon gate structure, which results in formation of a gate insulating layer, can help prevent boron implantation into the bulk of the gate oxide in the gate insulating layer.

However, DPN increases an interface charge between the gate insulating layer and the conductive material on top of the gate insulating layer. Often, this conductive material is a layer of polysilicon. DPN may also shift the flat band voltage of the device and induce negative bias temperature instability (NBTI) degradation.

Compounding these issues, DPN can be difficult to rework. This is because it may not be possible to remove a silicon nitride layer and recreate a silicon nitride layer with the required nitrogen content without permanently damaging the underlying gate insulating layer or other structures on the semiconductor substrate. As a result, semiconductor wafers that are subjected to an incomplete or otherwise incorrect DPN process may have to be discarded as scrap. Such wafers could otherwise result in compromised or nonfunctional devices if allowed to complete processing.

Inserting an anneal process after nitridation but before the next step in the manufacturing sequence, often polysilicon deposition, can address issues such as a shift in the flat band voltage and negative bias temperature instability (NBTI) degradation. Post-nitridation anneal, or PNA, chemically reduces meta-stable silicon-oxygen bonds in the gate oxide of the gate insulating layer and thus improves boron penetration resistance. A known method of PNA in the industry involves exposing wafers to nitrogen gas ($N_2$) during the annealing process.

An additional issue that may arise with the use of DPN is that nitrogen decay occurs over time after the DPN process is complete. The concentration of nitrogen in the silicon nitride layer comprising the top of the gate insulating layer decreases with time, and this ultimately results in a change in the threshold voltage (Vt) of the gate structure. PNA can be beneficial in addressing this problem, but even after an $N_2$-based PNA process, a detrimental nitrogen loss (0.5%) can occur approximately four hours after the DPN process finishes. This amount of decay can result in weaker Si—N bonds and therefore decreased protection from the penetration of implanted boron into the gate oxide of the gate insulating layer. This decreased protection in turn causes a Vt shift of 15-25 mV for a PMOS (p-channel metal oxide semiconductor) device. Thus, in a manufacturing environment, it is advisable to maintain a strict queue time of no more than four hours between the end of the DPN process and the beginning of the next step, polysilicon deposition. Once polysilicon is deposited, nitrogen decay from the silicon nitride layer of the gate insulating layer can no longer occur. The PNA process should therefore be performed within this queue time window to avoid unnecessary nitrogen decay.

However, it may be difficult in the manufacturing environment to perform a PNA step within this four-hour queue time window, especially when a furnace-type machine is used for the polysilicon deposition. DPN typically has a lower wafer per hour capacity than the polysilicon deposition process. An exemplary DPN process accommodates about 20.4 wafers/hour, while an exemplary polysilicon deposition processes four lots at once, with 25 wafers per lot. This means 100 wafers would have to leave the DPN equipment, complete PNA, and be ready for polysilicon deposition within four hours.

Alternatives to $N_2$-only PNA have been explored. For example, U.S. Published Patent Application No. 2003/0170956 to Zhong et al. ("Zhong") discloses a 4:1 mixture of $N_2$:$O_2$ being introduced in the annealing process. However, this process is performed in a furnace-type machine and therefore not in situ with the DPN process, which occurs in a chamber-type machine prior to the annealing process. Further, it is disadvantageous to have two sequential process steps respectively requiring two pieces of machinery within a short queue time window. For example, the two pieces of equipment may be spread across a large fabrication area and not adjacent to one another. In addition, semiconductor equipment often has an internal buffer of lots scheduled for processing ahead of any new lot that enters. Moreover, Zhong discloses that the $N_2$:$O_2$ process runs between 60 and 150 minutes, further challenging the queue time.

$N_2O$-only PNA has also been tested, and has demonstrated a lower nitrogen decay rate than $N_2$-only PNA, but a silicon nitride layer treated with $N_2O$-only PNA has about half the initial percentage of nitrogen present as does a layer treated with $N_2$-only PNA. Both $N_2$-only and $N_2O$-only PNA reduce interface charge to about the same extent. However, the shift in flat band voltage is much more pronounced for $N_2O$-only PNA, and this can be detrimental to the performance of the semiconductor device. Thus neither $N_2$-only nor $N_2O$-only PNA may entirely address the above mentioned problems of the prior art.

SUMMARY OF THE INVENTION

To resolve at least one of the disadvantages of the prior art discussed above, disclosed herein is a process for forming a silicon nitride layer on a gate oxide film as part of the formation of a gate structure in a semiconductor device, the process comprising forming a thin layer of silicon nitride on the top of a gate oxide film on a semiconductor substrate by a nitridation process, heating the semiconductor substrate in an annealing chamber, exposing the semiconductor substrate to $N_2$ in the annealing chamber and exposing the semiconductor substrate to a mixture of $N_2$ and $N_2O$ in the annealing chamber.

Also described herein is a process for reducing interface charge between a polysilicon layer and a gate insulating layer in a semiconductor device, comprising forming a thin layer of silicon nitride on the top of a gate oxide film on a semiconductor substrate by decoupled plasma nitridation (DPN), heating the semiconductor substrate in an annealing chamber, exposing the semiconductor substrate to $N_2$ in the annealing chamber, exposing the semiconductor substrate to a mixture of $N_2$ and $N_2O$ in the annealing chamber and depositing polysilicon on the silicon nitride layer.

The present inventors have found that using a two step PNA as disclosed herein, i.e., exposing the semiconductor substrate to $N_2$ in the annealing chamber and then exposing the semiconductor substrate to a mixture of $N_2$ and $N_2O$ in a second step in the annealing chamber, may overcome one or more of the disadvantages discussed above. For example, the process disclosed herein may reduce the shift in flat band voltage, reduce negative bias temperature instability (NBTI), and/or minimize reduction in threshold voltage in a semiconductor device. The process disclosed herein may also lower the rate of nitrogen decay, i.e., the rate of decrease of the nitrogen concentration of the silicon nitride film in the gate insulating film, after the DPN process is complete. Finally, the presently disclosed process may enhance the penetration resistance of a dopant, such as boron, used to form a p+ polysilicon gate structure in a semiconductor device.

BRIEF DESCRIPTION OF THE DRAWINGS

FIG. 4 is a table of boron penetration data for various experimental conditions of DPN and post-nitridation anneal.

FIG. 7 is a graph of standby current (IDS) versus threshold voltage (VTS) of a PMOS device for various post-nitridation anneal conditions.

DETAILED DESCRIPTION OF THE EMBODIMENTS

The embodiments of the invention will now be described. The descriptions and examples given should not be construed as limiting.

Disclosed herein is a process for forming a silicon nitride layer on a gate oxide film as part of the formation of a gate structure in a semiconductor device, comprising forming a thin layer of silicon nitride on the top of a gate oxide film on a semiconductor substrate by a nitridation process, heating the semiconductor substrate in an annealing chamber, exposing the semiconductor substrate to $N_2$ in the annealing chamber, and exposing the semiconductor substrate to a mixture of $N_2$ and $N_2O$ in the annealing chamber. The gate oxide film may have a thickness of 15-40 Å. In one embodiment, the thickness of the gate oxide film is 22 Å.

The nitridation process may be, for example, decoupled plasma nitridation (DPN). Other nitridation processes may also be used to produce the silicon nitride layer of the gate insulating layer. These processes may include chamber-based processes wherein a semiconductor wafer is exposed to a nitrogen-containing gas. These processes may or may not use plasma. The silicon nitride layer formed on the gate oxide film may have a thickness of 10-20 Å. In one embodiment, the silicon nitride layer has a thickness of 13 Å.

In accordance with at least one embodiment, during the annealing process that follows formation of the silicon nitride layer, the semiconductor substrate is exposed to $N_2$ and to a mixture of $N_2$ and $N_2O$, as two separate steps. Within the annealing chamber, a volume of $N_2$ is introduced for a set processing time. In the next step, a mixture of $N_2$ and $N_2O$ is introduced into the chamber for a set processing time. In one embodiment, the processing time for $N_2$ is 20 seconds (20") and the processing time for the $N_2/N_2O$ mixture is 10 seconds (10").

Figure 1:
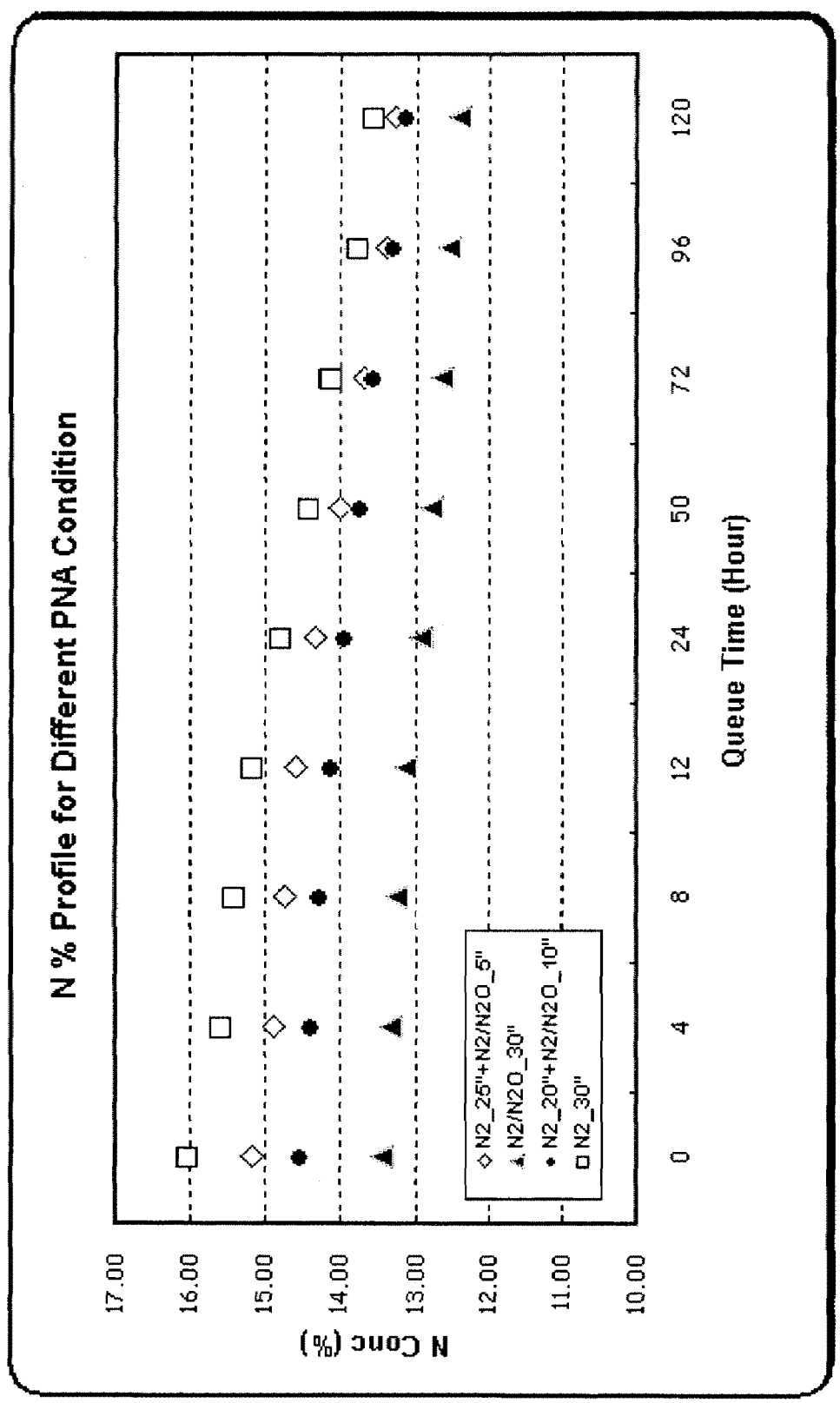
FIG. 1 is a graph of nitrogen percentage profiles for various post-nitridation anneal conditions.

The use of an $N_2/N_2O$ mixture for PNA, however, results in a lower initial percent nitrogen in the gate insulating layer than an $N_2$-only PNA. FIG. 1 is a graph of nitrogen percentage profiles for various post-nitridation anneal (PNA) conditions. More particularly, the graph in FIG. 1 shows the percentage of nitrogen in the silicon nitride layer within the gate insulating layer as a function of the queue time between nitridation and the next process step, such as polysilicon deposition. Nitrogen concentration in the silicon nitride layer is shown on the vertical axis as a percentage and queue time is shown on the horizontal axis in hours. Three alternative combinations of $N_2/N_2O$ PNA are shown as well as $N_2$-only PNA. FIG. 1 shows that the initial concentration of nitrogen in the gate insulating layer is higher with $N_2$-only PNA than with any of the $N_2/N_2O$ combination forms of PNA, as noted above. For the illustrated alternative in which the process time of $N_2$ is 20 seconds and the process time of $N_2/N_2O$ is 10 seconds, the initial nitrogen percentage is about 2% less than if $N_2$-only PNA is used.

It may be advantageous for the silicon nitride layer in the gate insulating layer to have a high initial percentage of nitrogen, to address the effects of nitrogen decay. However, a PNA process involving $N_2$ and $N_2O$ may result in a lower initial percentage of nitrogen in the silicon nitride layer than a PNA process that uses $N_2$ only. The inventors have found that the DPN process, which is prior to PNA, can be adjusted to achieve the same initial percentage of nitrogen in the film after PNA as when $N_2$-only PNA is used. One example of an adjustment that can be made is to increase the DPN process time by 10 seconds. A second example of a DPN process adjustment is to maintain the same process time, but increase the R.F. power setting for DPN by 150 Watts. FIG. 1 also shows that the illustrated alternative involving 30 seconds of an $N_2/N_2O$ mixture and no prior step of $N_2$-only has the lowest initial percentage of nitrogen in the silicon nitride layer. Thus, FIG. 1 illustrates the importance of including an $N_2$-only step in the PNA process. As will be further discussed, the inventors found that while performance may be comparable among some of the illustrated alternatives for a given issue, such as initial nitrogen percentage in the silicon nitride film, the two step PNA process, with a first step of $N_2$-only and a second step using a mixture of $N_2/N_2O$, demonstrated better overall results than the other illustrated alternatives.

In at least one embodiment, $N_2$ and $N_2O$ are present in a ratio of 10:1. The annealing temperature may range, for example, from 900° C. to 1050° C. and the pressure may range, for example, from 5 torr to 300 torr. In at least one embodiment, the annealing temperature is 950° C. and the pressure is 5 torr.

In at least one embodiment of the present disclosure, annealing is performed in situ after nitridation in a chamber process. This eliminates the need for moving semiconductor wafers from one piece of equipment, which performs only nitridation, to another piece of equipment, which performs only annealing. Therefore, the in situ anneal helps achieve higher productivity, and helps to meet the queue time limit between the end of the nitridation process and the beginning of the next process step, e.g., polysilicon deposition. As additional benefits, the wafers are not exposed to ambient air between the nitridation and anneal processes, and performing the anneal in situ prevents a decay of the nitrogen percentage in the silicon nitride layer from occurring between the nitridation and anneal processes.

In at least one embodiment of the present disclosure, the process described above is a process for forming a gate structure in a surface p-channel MOSFET. The process may also be used to form a surface n-channel MOSFET, or to form a buried-gate structure of either p-channel or n-channel type. The nitridation process employed in forming a gate structure in a surface p-channel MOSFET may be decoupled plasma nitridation (DPN). Other nitridation processes may be used to produce the silicon nitride layer. The gate structure formed may, for example, be a p+ polysilicon gate structure.

Also disclosed herein is a process for reducing interface charge between a polysilicon layer and a gate insulating layer in a semiconductor device, comprising a process as described above: forming a layer of silicon nitride on the top of a gate oxide film on a semiconductor substrate by decoupled plasma nitridation (DPN), heating the semiconductor substrate in an annealing chamber, exposing the semiconductor substrate to $N_2$ in the annealing chamber, and exposing the semiconductor substrate to a mixture of $N_2$ and $N_2O$ in the annealing chamber, followed by depositing polysilicon on the silicon nitride layer.

Figure 2:
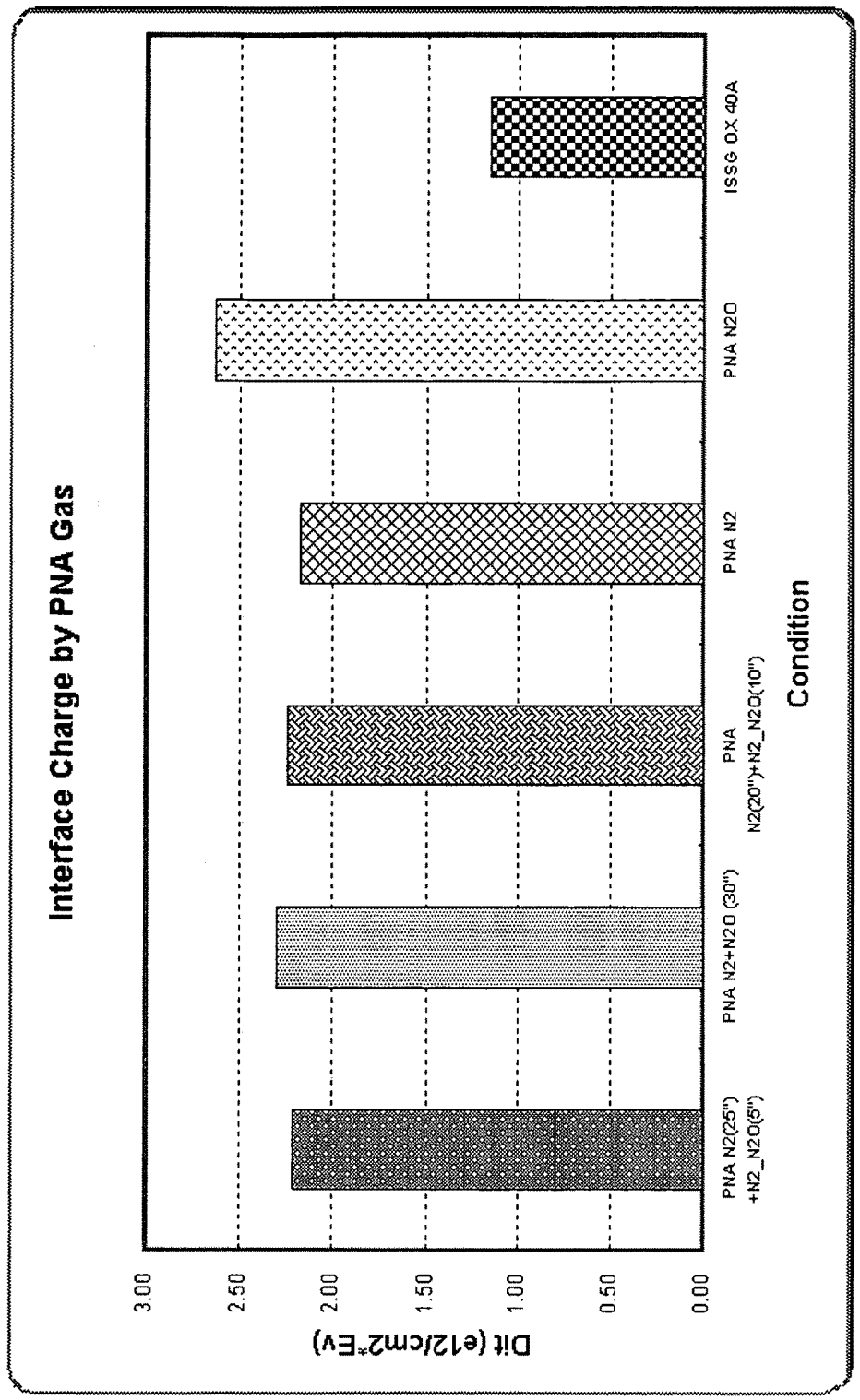
FIG. 2 is a chart showing interface charge for various post-nitridation anneal gas conditions.

FIG. 2 is a chart showing interface charge values for various conditions of PNA. As discussed above, the interface charge is the charge between the gate insulating layer and the conductive material on top of the gate insulating layer. The vertical axis shows interface charge (Dit) in units of $cm^2*Ev$ (electron-volt), with all data scaled by the order of $10^{12}$. The horizontal axis shows the PNA conditions. Three $N_2/N_2O$ combinations for PNA are shown, as well as $N_2$-only and $N_2O$-only PNA. The interface charge for a gate oxide that did not receive DPN and thus has no silicon nitride top layer (labeled "ISSG OX 40A") is also shown for comparison. FIG. 2 shows that a PNA process with a first step of $N_2$-only and a second step using a mixture of $N_2$ and $N_2O$ is comparable to $N_2$-only PNA in terms of interface charge. However, the two step process is more advantageous than $N_2O$-only PNA, with respect to providing a lower interface charge. As noted previously, the DPN process increases the interface charge. Thus, the gate oxide that did not receive DPN, labeled ISSG OX 40A, has the lowest interface charge.

Figure 3:
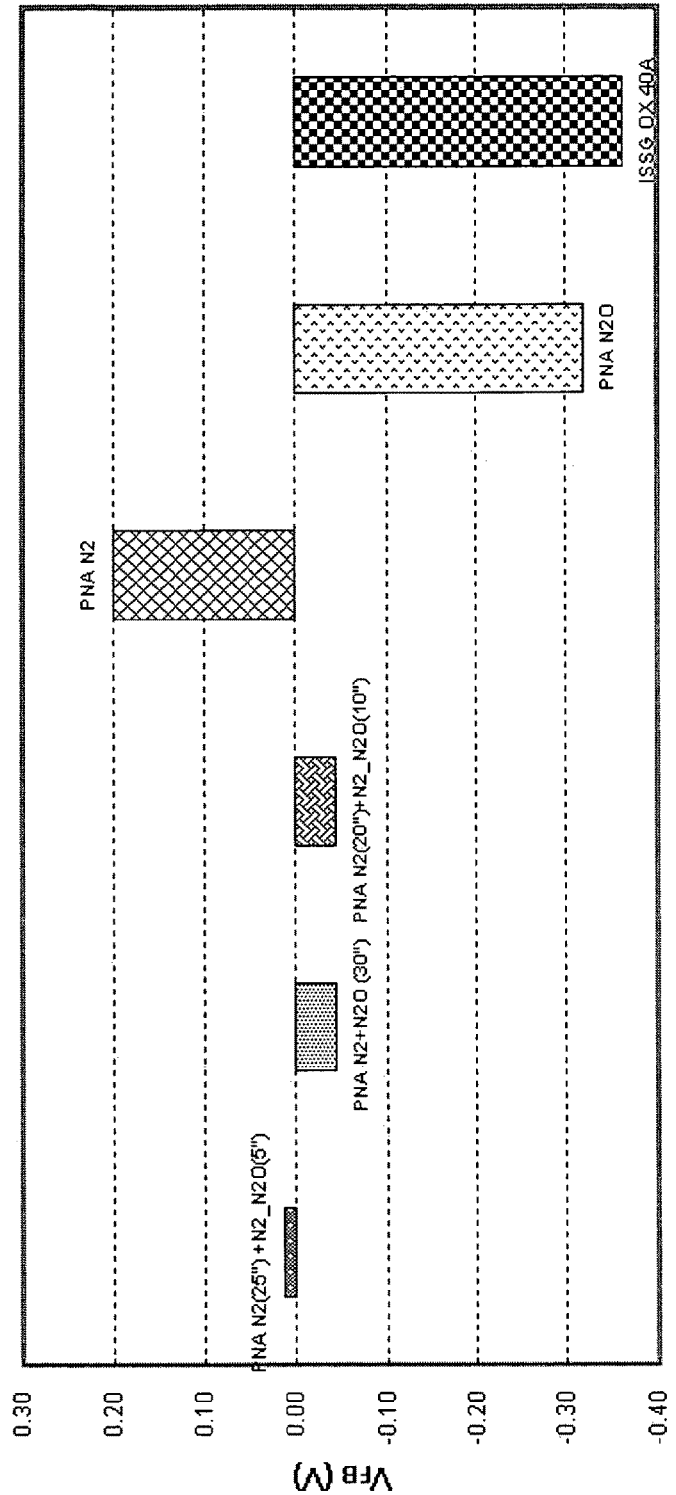
FIG. 3 is a chart showing flat band voltage for various post-nitridation anneal gas conditions.

As noted above, the presently disclosed process may reduce the shift in flat band voltage in a semiconductor device. FIG. 3 is a chart showing flat band voltage for the same PNA conditions shown in FIG. 2. Flat band voltage is shown on the vertical axis in units of volts, with the PNA conditions shown on the horizontal axis. As with interface charge, a two step PNA process with $N_2$-only in the first step and $N_2/N_2O$ in the second step results in a lower flat band voltage than a PNA process using either $N_2$ or $N_2O$ alone.

In yet another embodiment, the process disclosed herein is a process for enhancing dopant penetration resistance for a gate insulating layer in a semiconductor device. Boron may be used as the dopant in at least one embodiment. Boron penetration resistance is enhanced after the $N_2/N_2O$ PNA process because the silicon nitride layer of the gate insulating layer, which was formed by the nitridation process, is enhanced by the PNA process and is more dense than a layer formed by $N_2$ or $N_2O$ alone. FIG. 4 is a table of boron penetration data for films with various experimental conditions of DPN and PNA. The column of percentages listed under the "DPN" heading are the percentages of nitrogen in the silicon nitride film after PNA. The "PNA" column indicates whether $N_2$ or $N_2O$ was used in the PNA process. The two rows labeled "POR (skip)" did not receive either DPN or PNA, and did not receive a boron implantation. The two "POR (skip)" rows are shown for comparison. Capacitance data, in units of femtofarads per micrometer (fF/um), are shown for four device types: CA_OL_PD (PFET gate/drain overlap capacitor), CA_OL_PDK (PFET thick gate oxide/drain overlap capacitor), CA_OL_ND (NFET gate/drain overlap capacitor), and CA_OL_NDK (NFET thick gate oxide/drain overlap capacitor). Capacitance is related to the extent of boron penetration, in that greater boron penetration results in a higher capacitance value. FIG. 4 shows that the illustrated alternative of 16% $N_2O$ PNA resulted in better boron penetration resistance, and thus lower capacitance, than 16% $N_2$ PNA. The value 16% refers to the percentage of nitrogen in the silicon nitride film after PNA. Also, the $N_2O$ PNA process achieved the same percentage nitrogen in the film, yet also achieved better boron penetration resistance than the illustrated alternative of 16% $N_2$, which differed only in that it used $N_2$ instead of $N_2O$. These results illustrate a benefit of using $N_2O$ in the PNA process. Further, the illustrated alternative of 16% $N_2O$ PNA resulted in comparable capacitance to the "POR (skip)" alternatives, which did not receive boron implantation. Thus, the illustrated alternative of 16% $N_2O$ PNA provided the best boron penetration resistance (and thus lowest capacitance) of any of the illustrated alternatives that received PNA, for both PFET and NFET thick gateox/drain overlap capacitors.

Figure 5:
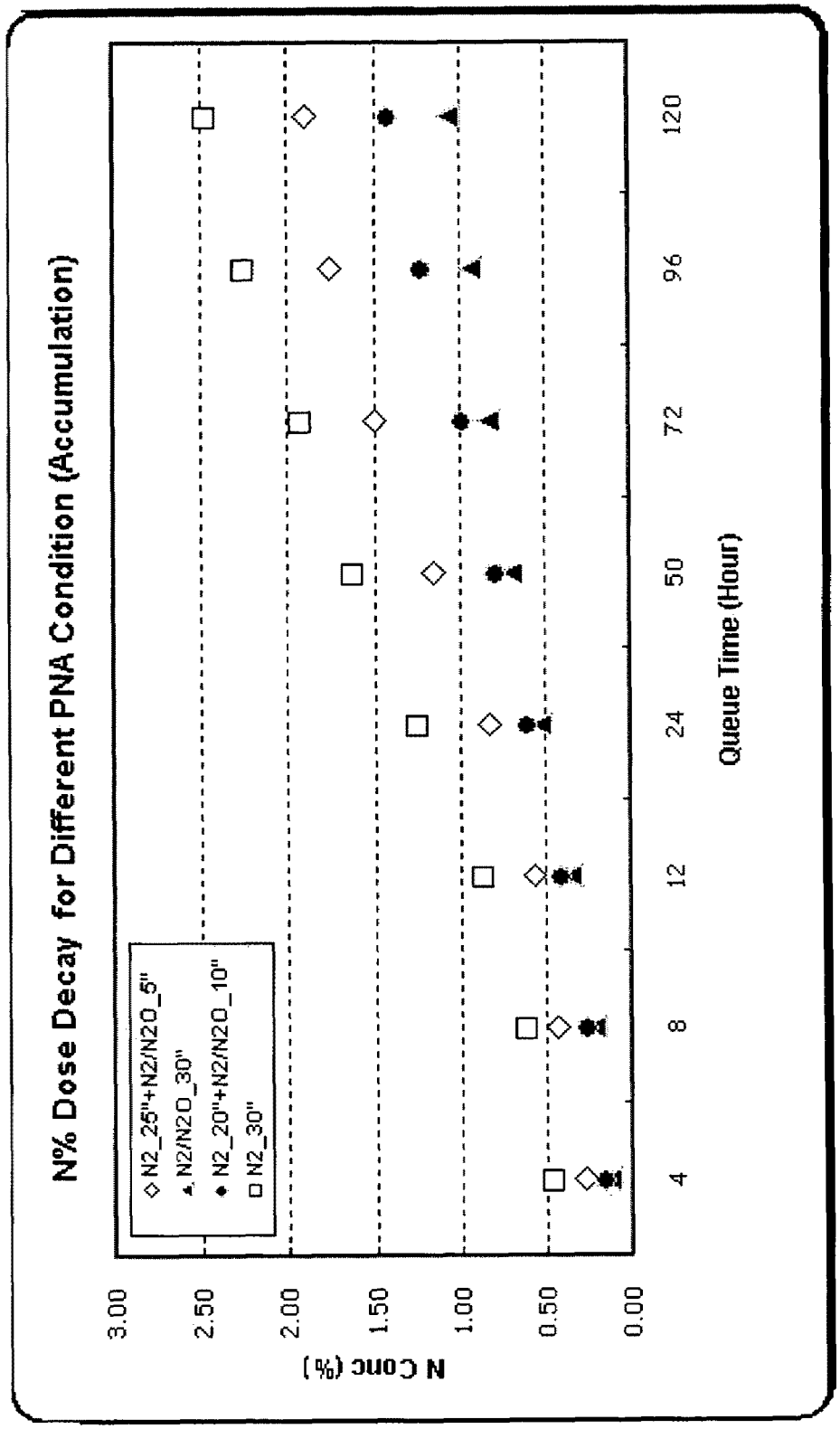
FIG. 5 is a graph of nitrogen percentage dose decay for various post-nitridation anneal conditions.

In a still further embodiment, the presently disclosed process may extend the nitrogen decay time for a gate insulating layer in a semiconductor device. FIG. 5 is a graph of nitrogen percentage dose decay for the various experimental conditions of PNA. Nitrogen percentage dose decay is the percent reduction in the nitrogen concentration of the silicon nitride layer of the gate insulating layer. The nitrogen percentage loss for the silicon nitride layer of the gate insulating layer is shown on the vertical axis as a percentage and the queue time between nitridation and the next process step, such as polysilicon deposition, is shown on the horizontal axis in hours. Results for three combinations of $N_2$ and $N_2O$ are shown, as well as N₂-only PNA. FIG. 5 shows that the nitrogen decay rate for N₂-only PNA is greater than that of any of the $N_2/N_2O$ combinations. Further, FIG. 5 shows that for two of the $N_2/N_2O$ PNA combinations, the queue time can be extended up to twelve hours before a decay of more than 0.5% occurs.

Figure 6:
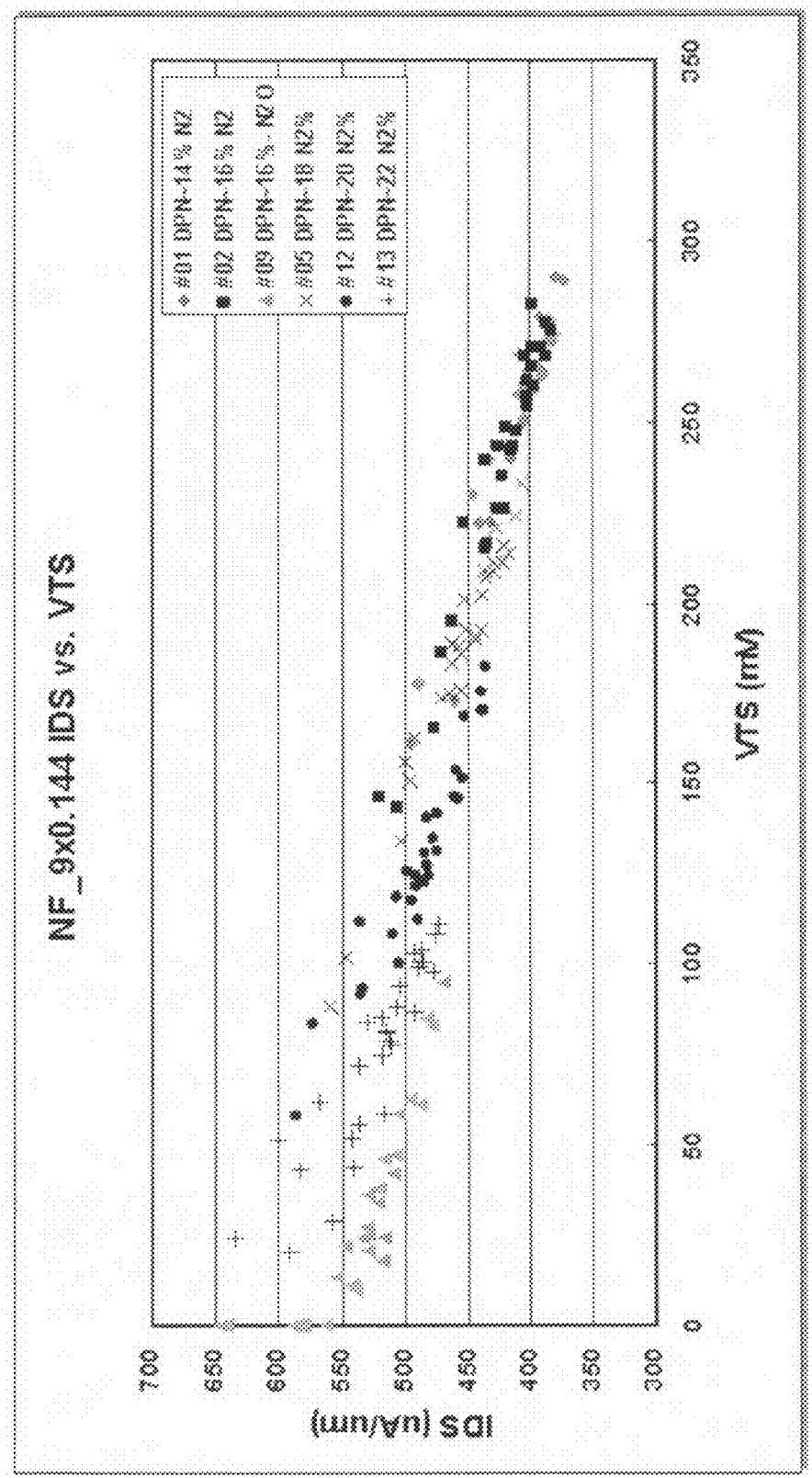
FIG. 6 is a graph of standby current (IDS) versus threshold voltage (VTS) of an NMOS device for various post-nitridation anneal conditions.

In addition, the present disclosed process may reduce negative bias temperature instability (NBTI) degradation and/or minimize the reduction in threshold voltage in a semiconductor device. FIG. 6 and FIG. 7 are graphs of standby current (IDS) versus threshold voltage (VTS) for various post-nitridation anneal conditions. Standby current is shown on the vertical axis of each figure, in units of microamperes per micron. Threshold voltage is shown on the horizontal axis of each figure, in units of millivolts. FIG. 6 shows data for an NMOS device and FIG. 7 shows data for a PMOS device. Each of FIGS. 6 and 7 shows one illustrated alternative that uses $N_2O$ PNA and has 16% nitrogen in the silicon nitride film due to DPN. The other five illustrated alternatives in each of FIGS. 6 and 7 use $N_2$-only PNA to achieve a percentage of nitrogen ranging from 14 to 22%. In addition, various DPN conditions were used to achieve nitrogen percentages ranging from 14-22%. In both FIG. 6 and FIG. 7, the illustrated alternative using $N_2O$ PNA achieved a comparable reduction in threshold voltage to the alternative that used $N_2$ only and had a nitrogen percentage of 22% after DPN. These results illustrate the extent to which the use of $N_2O$ in a PNA process may help minimize the reduction in threshold voltage.

The foregoing description has been presented for purposes of illustration. It is not exhaustive and does not limit the invention to the precise forms or embodiments disclosed herein. Modifications and adaptations of the invention will be apparent to those skilled in the art from consideration of the specification and practice of the disclosed embodiments of the invention.

Moreover, while illustrative embodiments of the invention have been described herein, the scope of the invention includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. Further, the steps of the disclosed methods may be modified in any manner, including by reordering steps and/or inserting or deleting steps, without departing from the principles of the invention. It is intended, therefore, that the specification and examples be considered as exemplary only, with a true scope and spirit of the invention being indicated by the following claims and their full scope of equivalents.

What is claimed is:

1. A process for forming a silicon nitride layer on a gate oxide film as part of formation of a gate structure in a semiconductor device, comprising:
   forming a layer of silicon nitride by a nitridation process on top of a gate oxide film present on a semiconductor substrate;
   heating the semiconductor substrate in an annealing chamber;
   exposing the semiconductor substrate to $N_2$ in the annealing chamber; and
   exposing the semiconductor substrate to a mixture of $N_2$ and $N_2O$ in the annealing chamber.

2. The process of claim 1, wherein the forming includes performing the nitridation process as decoupled plasma nitridation (DPN).

3. The process of claim 1, wherein the exposing of the semiconductor substrate to $N_2$ and the exposing of the semiconductor substrate to a mixture of $N_2$ and $N_2O$ are two separate steps.

4. The process of claim 1, wherein the exposing of the substrate to a mixture of $N_2$ and $N_2O$ includes providing the mixture such that the ratio of $N_2$:$N_2O$ is 10:1.

5. The process of claim 1, wherein the heating includes heating to an annealing temperature in a range from 900° C. to 1050° C. and providing a pressure in the annealing chamber in a range from 5 torr to 300 torr.

6. The process of claim 1, wherein the heating is performed in situ after nitridation in a chamber process.

7. The process of claim 1, wherein the semiconductor device formed is a surface p-channel MOSFET.

8. The process of claim 7, wherein the gate structure formed is a p+ polysilicon gate structure.

9. A process for reducing interface charge between a polysilicon layer and a gate insulating layer in a semiconductor device, comprising:
   forming a layer of silicon nitride on top of a gate oxide film on a semiconductor substrate by decoupled plasma nitridation (DPN);
   heating the semiconductor substrate in an annealing chamber;
   exposing the semiconductor substrate to $N_2$ in the annealing chamber;
   exposing the semiconductor substrate to a mixture of $N_2$ and $N_2O$ in the annealing chamber; and
   depositing polysilicon on the silicon nitride layer on the top of the gate oxide film;
   wherein the interface charge is no greater than $2.4 \times 10^{12}/cm^2 \ast eV$.

10. A process for enhancing dopant penetration resistance for the gate structure of claim 1, wherein the process comprises:
    forming a layer of silicon nitride on top of a gate oxide film on a semiconductor substrate by decoupled plasma nitridation (DPN);
    heating the semiconductor substrate in an annealing chamber;
    exposing the semiconductor substrate to $N_2$ in the annealing chamber; and
    exposing the semiconductor substrate to a mixture of $N_2$ and $N_2O$ in the annealing chamber.

11. The process of claim 10, wherein said dopant is boron.

12. A process for extending a nitrogen decay time, for a nitrogen concentration of the silicon nitride layer to decrease by 0.5%, for the gate structure of claim 1, comprising:
    forming a layer of silicon nitride on top of a gate oxide film on a semiconductor substrate by decoupled plasma nitridation (DPN);
    heating the semiconductor substrate in an annealing chamber;
    exposing the semiconductor substrate to $N_2$ in the annealing chamber;
    exposing the semiconductor substrate to a mixture of $N_2$ and $N_2O$ in the annealing chamber; and
    depositing polysilicon on the silicon nitride layer on the top of the gate oxide film;
    wherein the nitrogen decay time is greater than four hours.

13. The process of claim 12, wherein a queue time between completion of the DPN and the depositing is extended by up to 12 hours.

14. A process for reducing a shift in flat band voltage in a semiconductor device, comprising:
- forming a layer of silicon nitride on top of a gate oxide film on a semiconductor substrate by decoupled plasma nitridation (DPN);
- heating the semiconductor substrate in an annealing chamber;
- exposing the semiconductor substrate to $N_2$ in the annealing chamber; and
- exposing the semiconductor substrate to a mixture of $N_2$ and $N_2O$ in the annealing chamber;
- wherein the shift in the flat band voltage is less than $-0.4$ V.

* * * * *